United States Patent

Mulder

[15] 3,694,762

[45] Sept. 26, 1972

[54] VOLTAGE AMPLIFIER

[72] Inventor: Cornelis Mulder, Emmasingel, Eindhoven, Netherlands

[22] Filed: Nov. 13, 1970

[21] Appl. No.: 89,390

[30] Foreign Application Priority Data

Nov. 28, 1969 Netherlands..............6917885

[52] U.S. Cl. ........................330/24, 330/17, 330/22, 330/30 D, 330/38 M

[51] Int. Cl................................................H03f 3/04

[58] Field of Search .330/13, 17, 22, 24, 30 D, 38 M, 330/69

[56] References Cited

UNITED STATES PATENTS 3,577,167 5/1971 Avins.......................330/22 X

*Primary Examiner*—Roy Lake
*Assistant Examiner*—Lawrence J. Dahl
*Attorney*—Frank R. Trifari

[57] ABSTRACT

An increase voltage amplification is obtained by reduced direct current biassing of a diode connected as a collector load resistance, whilst retaining linearity.

18 Claims, 5 Drawing Figures

Figure 1:
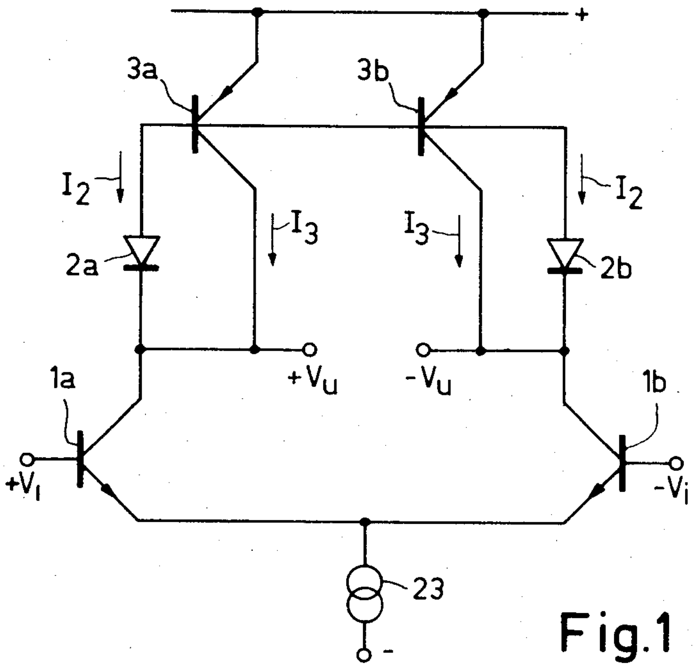

*INVENTOR.*
CORNELIS MULDER
*BY* [signature]
AGENT

INVENTOR.
CORNELIS MULDER
BY
Frank R. Trifari
AGENT

*INVENTOR.*
CORNELIS MULDER
*BY* Frank R. Trifari
AGENT

VOLTAGE AMPLIFIER

This invention relates to a transistor voltage amplifier in which the collector circuit of a first transistor includes as a collector load resistance at least one rectifying junction through which the collector current flows in the forward direction. Such a known amplifier has the advantage that the non-linearity between the emitter current and the emitter-base voltage of a transistor is more or less compensated for by a corresponding non-linearity of the current-voltage characteristic of the said rectifying junction so that, over a fairly large driving range, a linear relationship is obtained between the amplified voltage produced at the collector of the transistor and the input voltage applied to its base.

When using a single pn-junction of a metal-semiconductor junction as a collector load resistance, the resulting voltage amplification will be small. Hence, it is common practice to include several series-connected rectifiers in the collector circuit of the transistor. Equivalent to such a series connection is the use of a second auxiliary transistor the emitter-collector path of which is shunted by a potentiometer through which a current flows which is considerably smaller than that flowing through the auxiliary transistor, a tapping on the potentiometer being connected to the base of the auxiliary transistor so that the impedance of the part of the potentiometer between the base and the emitter of the auxiliary transistor is appreciably smaller than the base input resistance of the auxiliary transistor.

In general, the aforesaid known solutions are less satisfactory if the said first transistor is to be operated at a low bias current. Such a low bias current is desirable, for example, if the base input resistance of the transistor is to be high. This low bias current would in turn have to be obtained by means of large resistors, which creates a certain amount of difficulty when the amplifier is to be in integrated-circuit form. The use of several diodes in series as a collector resistor provides difficulty also because the number of diodes must be proportional to the desired amplification factor, which in the said integrated circuit involves a loss of space on the semiconductor element and a loss of supply voltage for the said first transistor.

The invention provides a particularly simple step to obviate the aforementioned disadvantages and is characterized in that by means of a second transistor of opposite conductivity type there is supplied to the collector of the first-mentioned transistor a bias direct current which is larger than the direct current flowing through the rectifying junction.

It should be noted that it is known to connect the collector emitter path of a transistor of opposite conductivity type as a collector load resistance for the first transistor. In this known circuit, the collector emitter path of the second transistor is the only load resistance for the first transistor, whereas in the amplifier according to the invention the internal resistance of the said pn-junction determines the collector load resistance of the first transistor, but the internal collector resistance of the second transistor is high compared with the internal resistance of the pn-junction so that the non-linear current-voltage characteristic of the pn-junction is fully utilized.

The invention is based on the recognition that the current-voltage characteristic produced by the emitter current and, neglecting the base current, by the collector current also of the first transistor as a function of its emitter-base voltage and also the current-voltage characteristic of the said pn-junction have an exponential nature, so that the derivative of the current with respect to the voltage is proportional to the bias direct current. Since a considerably smaller direct current flows through the pn-junction than through the base-emitter junction of the transistor, this enables the dynamic resistance of the said pn-junction to be appreciably increased while retaining the aforementioned compensation of the non-linearity.

Figure 2:
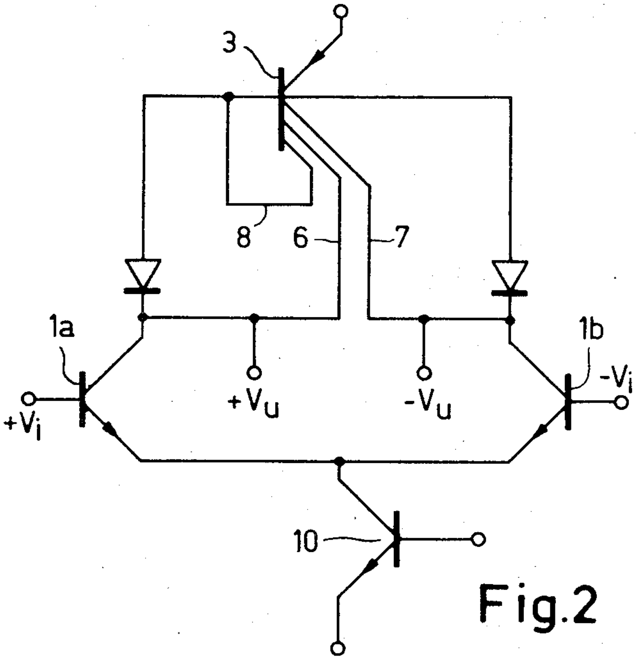
Figure 3:
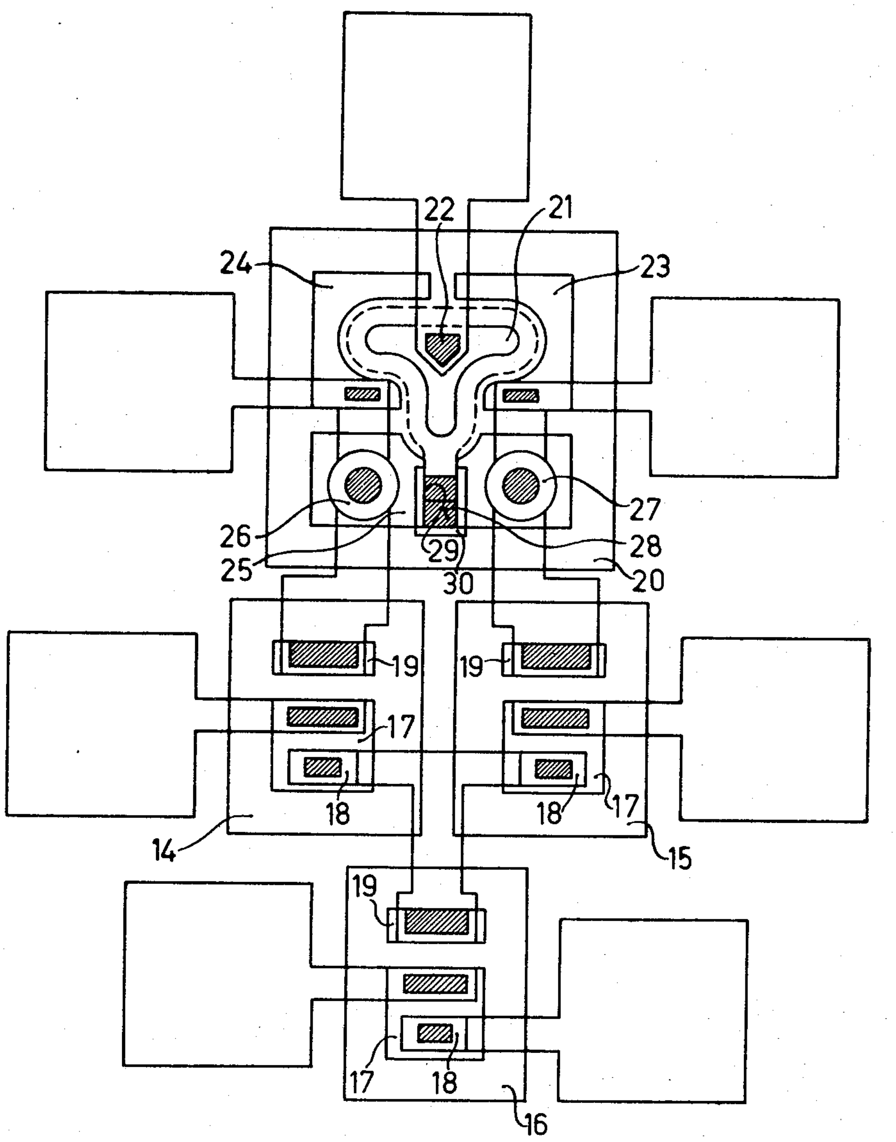
Figures 4, 5:
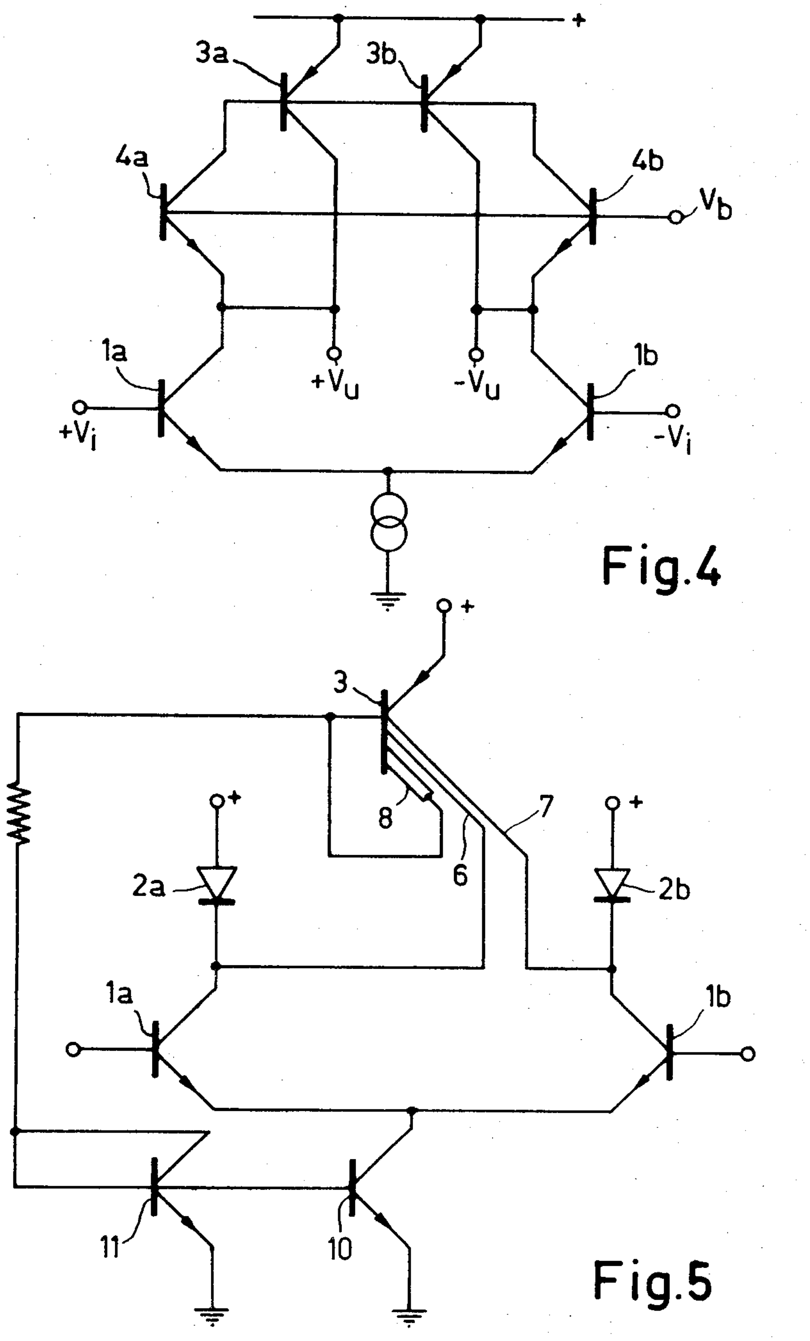

Embodiments of the invention will now be described, by way of example, with reference to the accompanying diagrammatic drawings, in which:

FIG. 1 is a circuit diagram of a first embodiment of a voltage amplifier according to the invention, FIG. 2 is a circuit diagram of a modification of the amplifier of FIG. 1, FIG. 3 shows the lay-out of a circuit according to FIG. 2, FIG. 4 is a circuit diagram of a second embodiment, and FIG. 5 is a circuit diagram of a third embodiment.

FIG. 1 shows a differential amplifier which includes two amplifier transistors 1*a* and 1*b* in the common emitter lead of which there is connected a current source 2I, the internal resistance of which is large compared with the emitter input resistance of the transistors 1*a* and 1*b*. An input voltage $+V_i$ and $-V_i$ to be amplified is applied in push-pull to the bases of the transistors. The collector circuits of the transistors 1*a* and 1*b* include pn-diodes 2*a* and 2*b*, respectively, the pass direction of which corresponds to the direction of the collector currents flowing through the respective transistors 1*a* and 1*b*. The terminals of the diodes 2*a* and 2*b* not connected to the collectors are connected to a point of constant potential or, as is shown in the Figure, to the bases of two auxiliary transistors 3*a* and 3*b* which are of a conductivity type opposite to that of the first transistors. The emitters of transistors 3a and 3b are connected to a supply terminal, while their collectors are connected to the collectors of the first-mentioned transistors 1 *a* and 1*b*, respectively. Thus, an amplified voltage $+V_u$ and $-V_u$ is set up between the collectors of the transistors 1*a* and 1*b*, respectively. If this output voltage $\pm V_u$ is fed back crosswise to the bases, a trigger circuit of the Eccles-Jordan type is obtained.

Assuming the direct current through the diodes 2*a* and 2*b* to be $I_2$ and the collector direct current of the transistors 3*a* and 3*b* to be $I_3$, then the current of the current source 2I is equal to the sum of all the aforementioned direct currents (i.e. $I = I_2 + I_3$). The dynamic resistance of the diodes 2*a* and 2*b* will therefore have been increased by a factor $I/I_2$ so that, if $I_3$ is considerably greater than $I_2$, a correspondingly large voltage amplification is obtained. Since in the embodiment shown in FIG. 1, $I_2$ is also equal to the base current of the transistors 3*a* and 3*b* and $I_3$ is equal to the collector direct current of these transistors, the said condition can simply be satisfied.

In the integrated-circuit technique of FIGS. 2 and 3, the transistors 1*a* and 1*b* will as a rule be designed as "-vertical transistors", i.e. in a top plan view of the upper surface of such a semiconductor element the active portions of the emitter, base and collector regions will be disposed one on top of the other. The current source 2I will also be designed as a vertical transistor 10 of the same conductivity type as that of the transistor 1*a* and 1*b*. In contradistinction thereto, the transistors 3*a* and 3*b* will preferably be designed as lateral transistors, i.e. in a top plan view of the semiconductor element the active portions of the emitter, base and collector regions will be located side by side. The diodes 2*a* and 2*b* may be designed as Schottky diodes, which have the advantage that they exhibit substantially no storage and hence are faster.

Because both the emitters and the bases of the transistors 3*a* and 3*b* are electrically interconnected, the transistors 3*a* and 3*b* may simply be combined by locating two collector regions 6 and 7 opposite a single emitter region, as is shown in FIG. 2. If, in addition, a third collector region 8 is arranged opposite the single emitter region, which third collector region is conductively interconnected with the base, the direct current from the emitter region will be divided between the three collector regions in proportions according to the length dimensions of the opposed regions.

FIG. 3 shows the lay-out of such an integrated circuit. The npn transistors 1*a*, 1*b*, and 10 of FIG. 2 are disposed in three isolated islands 14, 15 and 16 of a semiconductor body. Each of these islands, which are of n type conductivity, accommodates a p type base region 17, an n type emitter region 18 and a collector contact region 19 produced simultaneously with the emitter region. An island 20 contains the remainder of the circuit arrangement of FIG. 2, with the use of a lateral pnp transistor of a particular geometry, which may advantageously be used also in arrangements other than the amplifier circuit under consideration. This lateral pnp transistor has a region 21 including a central part which is large enough for providing a contact to this region, and in this portion a contact opening 22 has been made in the passivating insulating layer with which the surface of the semiconductor body has been coated. This contact part has at least one extended portion (in the present embodiment there are three), which may be narrow since they are not metallized. In the present embodiment the region 21 forms the emitter region of the lateral transistor around which collector regions 23, 24 and 25 may be arranged.

The geometry of the emitter region 21 provides a large peripheral length and at the same time a comparatively small surface area. The term "peripheral length" is used herein to mean the length of the intersection between the relevant pn-junction and the semiconductor surface.

A large peripheral length is desirable because the current distribution between the collector regions 23, 24 and 25 depends upon the ratios between the peripheral lengths of the sides of the collector regions adjacent the emitter region 21. For a predetermined ratio to be realized with sufficient accuracy, the said peripheral length of the collector regions and hence the total length of the emitter region must not be too small. Further, the ratio between peripheral length and surface area of the emitter region is related to the collector-emitter current amplification factor $\alpha'$ of the lateral transistor. The minority carriers injected at the periphery of the emitter region will largely be collected by the collector regions, but the larger part of the carriers injected in a direction at right angles to the semiconductor surface will be lost by recombination. A large ratio between the peripheral length and the surface area has a beneficial influence on the emitter efficiency and hence on the said current amplification factor. This applies in particular in the case of small emitter currents of the order of microamperes or smaller, in which case the voltage drop due to the current flowing in the non-contacted extended portions of the emitter region is substantially negligible. The more or less star-shaped emitter region 21 has three extending portions which each have a length of, say, about 12 μm and a width of, say, about 4 μm.

The collector region 25 is larger than is strictly necessary and consequently sufficient space will be available to accommodate two n type regions 26 and 27, which together with the region 25 form the two pn diodes of the circuit. The region 25 has a cut-away portion in which a contact region 28 has been produced at the same time as have been the emitter regions 18 and the diode regions 26 and 27. Through an opening 29 in the insulating layer and a metal layer 30 provided therein, the collector region 25 is short-circuited to the base region of the lateral transistor in the form of the island 20. Thus, the lateral transistor having several collectors and the two diodes connected to the base region thereof have been accommodated in a particularly compact structure which occupies little space.

Beneath the emitter region 21 and the base contact 30 there has been provided in known manner a buried layer, i.e. a part having a resistivity lower than that of the adjoining part of the islands. The buried layer is shown in the Figure by a broken line. The injection of carriers in a direction at right angles to the semiconductor surface may be reduced by causing the emitter region and the buried layer to approach one another sufficiently. However, this structure may, if desired, be realized without a buried layer or with a buried layer which extends beneath the collector regions also.

The interconnections and terminals required for the circuit have been realized in the usual manner by a metallization pattern applied to the insulating layer and connected to the various semiconductor regions of the circuit elements through openings in the insulating layer.

For the sake of completeness it should be noted that the lateral transistor may alternatively be designed so as to have a different geometry, for example, by providing at least one circular or dot-shaped emitter region around which at least one collector region is arranged.

Otherwise the integrated circuit shown in FIG. 3 may be manufactured and mounted entirely in a manner usual in semiconductor technology, for example, by starting from a p type substrate on which, if desired, there is formed by diffusion at least one buried layer. Next an n type epitaxial layer is provided having a thickness of, say, about 4 μm and a resistivity of, say, from 0.3 to 0.6 ohm-cm. Then, for example, phosphorus and boron may be diffused by means of conventional photolithographic and masking techniques to produce the isolating regions and the various semiconductor regions of the circuit elements. The boron diffused regions 17, 21, 23, 24 and 25 have a sheet resistance of, say, from about 125 to 200 ohms per square.

If desired, the diodes 2*a* and 2*b* of FIG. 1 may be replaced by the collector-emitter paths of two further auxiliary transistors 4*a* and 4*b*, respectively, as is shown in FIG. 4. The balanced signal $\pm V_i$ to be amplified is again applied to the bases of the amplifier transistors 1*a* and 1*b*, the collector leads of which now include the auxiliary transistors 4*a* and 4*b*, respectively, whereas the direct currents for the collectors of the transistors 1*a* and 1*b* are mainly supplied by means of the transistors 3*a* and 3*b* of the opposite conductivity type. The bases of the transistors 4*a* and 4*b* are connected to a point of constant potential $V_b$, resulting in an additional degree of freedom for achieving an optimum setting. Thus, the base-emitter junctions of the auxiliary transistors 4*a* and 4*b* again form the collector load resistances for the transistors 1*a* and 1*b*, respectively, and the direct currents flowing through the transistors 4*a* and 4*b* are again equal to the base direct currents of the transistors 3*a* and 3*b*, respectively, which again are considerably smaller than the collector direct currents thereof. This arrangement results in the same operation as that of the amplifier shown in FIG. 1. Obviously, the step described with reference to FIGS. 2 and 3 may also be applied to the amplifier of FIG. 4.

In the modified embodiment shown in FIG. 5 the diodes 2*a* and 2*b* have their anode terminals connected to a point of fixed potential (i.e. the positive supply terminal). The (lateral) transistor 3 of the opposite conductivity type has its collectors 6 and 7 once again connected to the collectors of the transistors 1*a* and 1*b*, respectively. The collector 8 of the transistor 3, the collecting peripheral length of which is about twice that of the collectors 6 and 7, is connected not only to the base of the transistor 3, but also to the base of the transistor 10, which acts as a current source. The base emitter path of transistor 10 is shunted by a diode or a transistor 11 connected as a diode. Thus, the current of the base and the collector 8 of the transistor 3 produces a substantially equal collector current in the transistor 10, so that by suitably proportioning the collecting length of the collector 8 relative to that of the collectors 6 and 7 it is possible to ensure that the direct current flowing through the transistors 1*a* and 1*b* is just slightly greater than the direct current supplied by the collectors 6 and 7. As a result, the diodes 2*a* and 2*b* are again operated at a high dynamic resistance, which, however, is lower than the internal collector resistances measured at the collectors 6 and 7.

What is claimed is:

1. A transistor voltage amplifier comprising a first transistor, at least one element with a rectifying junction connected in the collector circuit of the first transistor and through which the transistor collector current flows in the forward direction; said element serving as the collector load resistance of said transistor through which a bias direct current flows, a second transistor of opposite conductivity type to said first transistor, means connecting the collector of said second transistor to the collector of the first transistor to supply thereto a bias direct current that bypasses said element, means for forward biassing the base-emitter junction of the second transistor to supply a bias direct current to the collector of the first transistor which is considerably greater than the bias direct current flowing through the element with the rectifying junction.

2. An amplifier as claimed in claim 1, further comprising means connecting the element with the rectifying junction between the base of the second transistor and the collector of the first transistor.

3. An amplifier as claimed in claim 1 wherein the element with the rectifying junction comprises a Schottky diode.

4. An amplifier as claimed in claim 1 wherein the element with the rectifying junction comprises a further transistor of the same conductivity type as the first transistor and connected so that its base-emitter path carries the lower bias current.

5. An amplifier as claimed in claim 1 further comprising a third transistor of the same conductivity type as the first transistor and with a second element with a rectifying junction similarly connected in its collector circuit, means connecting said first and third transistors in push-pull arrangement, and wherein the second transistor is in the form of a transistor having one emitter, one base and two collector regions which are individually connected to the collectors of said first and third transistors, and means for applying to the bases of said first and third transistors a balanced input voltage to be amplified.

6. An amplifier as claimed in claim 5, characterized in that the second transistor is further provided with a third collector region which is electrically interconnected to its base.

7. An amplifier as claimed in claim 5 further comprising, means connecting the emitters of the first and third transistors together a fourth transistor connected as a current source in the common emitter lead of the first and third transistors, and means connecting the base of the second transistor to the base of the current source transistor.

8. A semiconductor device suited for use in a transistor amplifier as claimed in claim 1 characterized in that a semiconductor body contains a lateral transistor the base region of which is of the one conductivity type and adjoins at least one emitter region and at least one collector region of the other conductivity type and surrounds these regions within the semiconductor body, one of the two latter regions extending to a surface of the semiconductor body and having a contact part from which extends at least one extended portion, the other of the said two regions at least partially surrounding the extended portion at the surface.

9. A semiconductor device as claimed in claim 8, characterized in that the region provided with extended portions is the emitter region of the transistor which has arranged around it at least two collector regions, one of which is conductively connected to the base region of the transistor and includes at least one diode region in the form of a surface region of the one conductivity type.

10. A compensated transistor amplifier comprising, a first transistor, a collector load therefor comprising a semiconductor diode element connected between the collector of the transistor and a point of constant voltage and poled to pass a first bias current to said transistor collector electrode, a second transistor of opposite conductivity type to that of the first transistor, means connecting the emitter-collector path of said second transistor in series with the emitter-collector path of said first transistor across the terminals of a source of supply voltage in a manner such that the collector current of the second transistor bypasses said diode element, and means for biasing the base electrode of the second transistor to supply a second bias current to the first transistor collector of a magnitude that is large relative to the first bias current flowing through the diode element.

11. An amplifier as claimed in claim 10 wherein said first transistor comprises an npn and said second transistor comprises a PNP device, and wherein said diode element is connected between the collector of the first transistor and the base of the second transistor.

12. An amplifier as claimed in claim 10 wherein said diode element comprises the base-emitter junction of a third transistor having its emitter-collector path connected between the collector of the first transistor and the base of the second transistor and with its base connected to said point of constant voltage.

13. An amplifier as claimed in claim 10 further comprising, a third transistor of the same conductivity type as the first transistor, a fourth transistor of the same conductivity type as the second transistor, a second semiconductor diode element connected between the collector of the third transistor and said point of constant voltage and poled to pass a third bias current to said third transistor collector electrode, means connecting the emitter-collector path of said fourth transistor in series with the emitter-collector path of said third transistor across said supply source terminals such that the collector current of the fourth transistor bypasses said second diode element, means for biasing the base electrode of the fourth transistor to supply a fourth bias current to the third transistor collector of a magnitude that is large relative to the third bias current flowing through the second diode element, and means for applying an input signal to the base electrodes of said first and third transistors.

14. An amplifier as claimed in claim 13 wherein said biasing means includes means connecting the base electrodes of said second and fourth transistors together and to one terminal of said first and second diode elements.

15. An amplifier as claimed in claim 13 wherein said first and third transistors comprise npn devices and said second and fourth transistors comprise pnp devices.

16. An amplifier as claimed in claim 13 wherein said second and fourth transistors are combined together in the form of an integral transistor having one emitter region, one base region and first and second collector regions, said first and second collector regions being connected to the collectors of said first and third transistors, respectively.

17. An amplifier as claimed in claim 16 wherein said integral transistor further comprises a third collector region, said amplifier further comprising means connecting the third collector region to said one base region.

18. An amplifier as claimed in claim 16 wherein said first and second diode elements are connected between the base region of said integral transistor and the collectors of said first and third transistors, respectively.

* * * * *

PO-1050
(5/69)

UNITED STATES PATENT OFFICE
CERTIFICATE OF CORRECTION

Patent No. 3,694,762 Dated September 26, 1972

Inventor(s) CORNELIS MULDER

It is certified that error appears in the above-identified patent and that said Letters Patent are hereby corrected as shown below:

ON THE TITLE PAGE between "Inventor" and "Filed" insert as follows:

-- Assignee: U.S. Philips Corporation, New York, N.Y. --;

Signed and sealed this 27th day of November 1973.

(SEAL)
Attest:

EDWARD M.FLETCHER,JR.
Attesting Officer

RENE D. TEGTMEYER
Acting Commissioner of Patents